US005872740A

United States Patent [19]

Loughmiller et al.

[11] Patent Number: 5,872,740

[45] **Date of Patent: *Feb. 16, 1999**

[54] SYSTEM AND METHOD FOR AN ANTIFUSE BANK

[75] Inventors: Daniel R. Loughmiller; Kevin G. Duesman, both of Boise, Id.

[73] Assignee: Micron Technology, Inc., Boise, Id.

[ * ] Notice: The term of this patent shall not extend beyond the expiration date of Pat. No. 5,724,282.

[21] Appl. No.: 917,441

[22] Filed: Aug. 22, 1997

Related U.S. Application Data

[63] Continuation of Ser. No. 708,920, Sep. 6, 1996, Pat. No. 5,724,282.

[51] Int. Cl.[6] .................... G11C 17/16

[52] U.S. Cl. .................... 365/225.7; 365/96

[58] Field of Search .................... 365/225.7, 96, 365/200, 201; 257/50, 530

[56] References Cited

U.S. PATENT DOCUMENTS

| | | | |
|---|---|---|---|
| 4,546,455 | 10/1985 | Iwahashi et al. | 365/225.7 |
| 5,008,855 | 4/1991 | Eltoukhy et al. | 365/96 |
| 5,110,754 | 5/1992 | Lowrey et al. | 437/57 |
| 5,148,391 | 9/1992 | Zagar | 365/96 |
| 5,200,652 | 4/1993 | Lee | 307/465 |
| 5,233,206 | 8/1993 | Lee et al. | 257/50 |
| 5,241,496 | 8/1993 | Lowrey et al. | 365/96 |
| 5,257,222 | 10/1993 | Lee | 365/96 |
| 5,257,225 | 10/1993 | Lee | 365/96 |
| 5,272,388 | 12/1993 | Bakker | 365/96 |
| 5,299,152 | 3/1994 | Ishihara et al. | 365/96 |
| 5,313,424 | 5/1994 | Adams et al. | 365/200 |
| 5,315,553 | 5/1994 | Morris | 365/201 |
| 5,324,681 | 6/1994 | Lowrey et al. | 437/52 |
| 5,331,196 | 7/1994 | Lowrey et al. | 257/529 |
| 5,371,414 | 12/1994 | Galbraith | 365/96 |
| 5,379,250 | 1/1995 | Harshfield | 365/105 |
| 5,424,988 | 6/1995 | McClure et al. | 365/201 |
| 5,426,614 | 6/1995 | Harward | 365/96 |
| 5,444,290 | 8/1995 | Paz De Araujo et al. | 257/530 |
| 5,513,144 | 4/1996 | O'Toole | 365/200 |
| 5,642,316 | 6/1997 | Tran et al. | 365/225.7 |
| 5,657,280 | 8/1997 | Shin et al. | 365/225.7 |
| 5,724,282 | 3/1998 | Loughmiller et al. | 365/225.7 |

*Primary Examiner*—Tan T. Nguyen
*Attorney, Agent, or Firm*—Schwegman, Lundberg, Woessner & Kluth, P.A.

[57] ABSTRACT

An antifuse bank (200) for an integrated circuit. The antifuse bank (200) includes a plurality of word lines (246) and digit lines (244) disposed to form an array. The antifuse bank (200) also includes a plurality of antifuse cells (230). Each antifuse cell (230) includes an antifuse (242) that is programmable to one of two fixed states. Each antifuse cell (230) also includes an access device (240) coupled to one of the word lines (246) and one of the digit lines (244) and coupled to the antifuse (242) of the antifuse cell (230). The antifuse bank (200) further includes an addressing circuit (248, 250) coupled to the array that selects an antifuse (242) of the array to be accessed. The antifuse bank (200) also includes a sensing circuit (228) coupled to the array that senses the state of the selected antifuse (242).

12 Claims, 3 Drawing Sheets

SYSTEM AND METHOD FOR AN ANTIFUSE BANK

This application is a continuation of U.S. patent application Ser. No. 08/708,920, filed Sep. 6, 1996 now U.S. Pat. No. 5,724,282.

THE FIELD OF THE INVENTION

This invention relates to integrated circuits and, more particularly, to a system and method for an antifuse bank.

BACKGROUND OF THE INVENTION

Integrated circuits (ICs) often require selective one time programmable (OTP) permanent electrical connections between circuit nodes. Such a connection can be implemented by an antifuse. Antifuses are often used to permanently store binary data on an IC. Binary logic states are represented by "on" and "off" states of the antifuse. Antifuses are used in numerous memory storage applications including programmable logic arrays (PALs), programmable logic devices, and programmable read only memories (PROMs). Antifuses are also often used in memory cell arrays such as dynamic random access memories (DRAMs). After testing the DRAM for failing memory cells, failing cell addresses in the DRAM are remapped to functional cell addresses by selective permanent programming of antifuse elements.

Antifuses are fabricated with structure similar to that of a capacitor; two conductive electrical terminals are separated by a dielectric layer. An unprogrammed "off" state, in which the antifuse is fabricated, presents a high resistance between the antifuse terminals. The antifuse can also be programmed to an "on" state in which a low resistance connection between the antifuse terminals is desired. To program an antifuse "on," a large programming voltage is applied across the antifuse terminals, breaking down the interposed dielectric and forming a conductive link between the antifuse terminals.

Once an antifuse has been programmed, it permanently retains its programmed state. Correctly detecting the programmed state of an antifuse is complicated by variations in the fabrication process, inherent time delay, and degradation of the antifuse dielectric over time. Typical antifuses are implemented as relatively large elements to offset these and other complications. Large antifuses are more robust and less prone to degradation over time.

However, as integrated circuit technology advances, the size of individual circuit elements decreases. Thus, designers can include more storage cells in a memory array on a semiconductor substrate. As the number of storage cells increases, the number of antifuses needed also increases. Unfortunately, conventional antifuses are too large to fulfill the growing need for more antifuses in memory devices.

For the reasons stated above, and for other reasons stated below which will become apparent to those skilled in the art upon reading and understanding the present specification, there is a need in the art for antifuse elements that conserve semiconductor substrate surface area while maintaining high reliability characteristics.

SUMMARY OF THE INVENTION

The above mentioned problems with antifuses and other problems are addressed by the present invention, which will be understood by reading and studying the following specification. An antifuse bank is described which is configured as an array of cells that is similar to a conventional DRAM array.

In particular, one embodiment of the present invention provides an antifuse bank for an integrated circuit. The antifuse bank includes a plurality of word and digit lines disposed to form an array. The antifuse bank also includes a plurality of antifuse cells. Each antifuse cell includes an antifuse that is programmable to one of two fixed states. Each antifuse cell also includes an access device coupled to one of the word lines and one of the digit lines and coupled to the antifuse of the antifuse cell. The antifuse bank further includes an addressing circuit coupled to the array that selects an antifuse of the array to be accessed. The antifuse bank also includes a sensing circuit coupled to the array that senses the state of the selected antifuse.

DETAILED DESCRIPTION

In the following detailed description, reference is made to the accompanying drawings which form a part hereof, and in which is shown by way of illustration specific embodiments in which the invention may be practiced. It is to be understood that other embodiments may be utilized and structural or logical changes may be made without departing from the scope of the present invention. The following detailed description, therefore, is not to be taken in a limiting sense.

Figure 1:
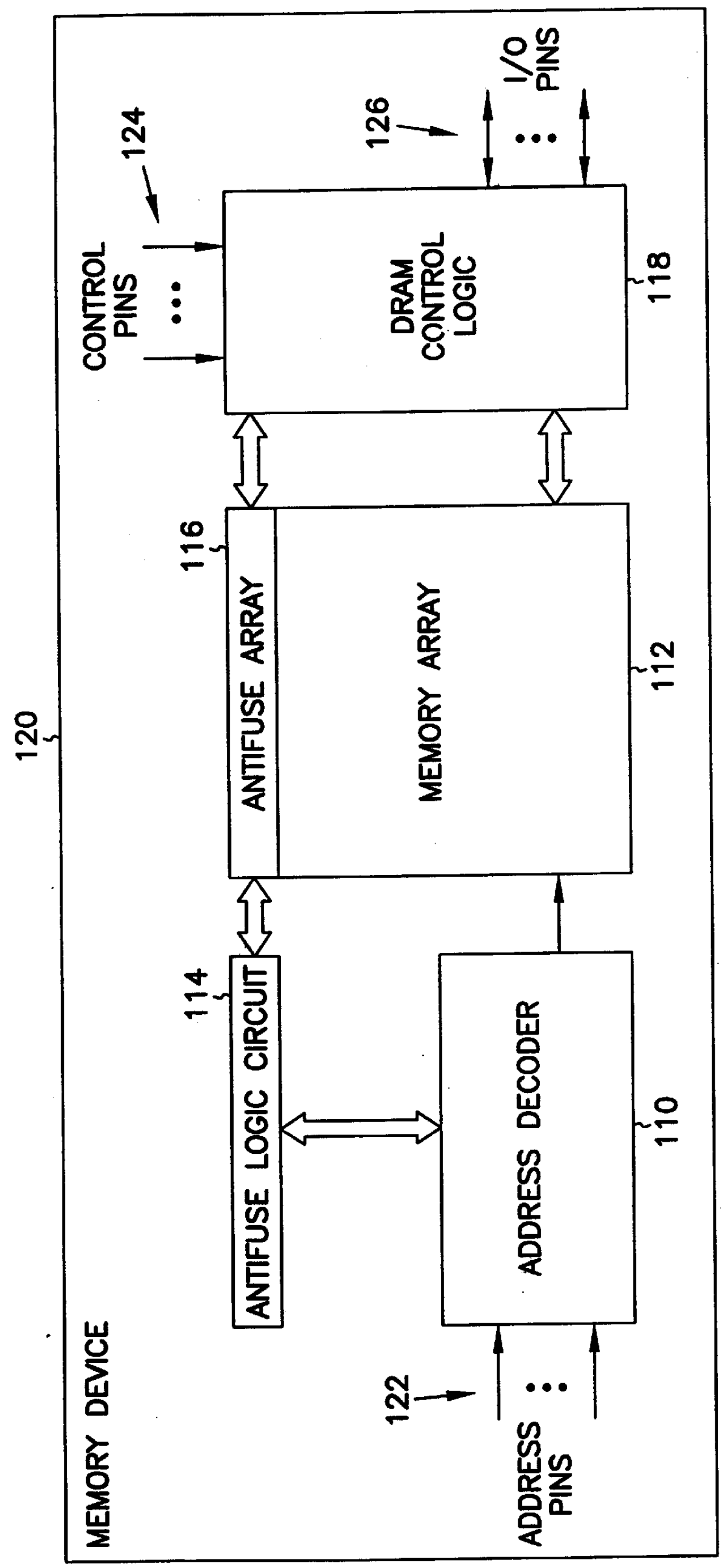
FIG. 1 is a block diagram of an embodiment of the present invention that includes an antifuse bank configured as an array of antifuse cells.

FIG. 1 is a block diagram of a memory device, indicated at 120, according to an embodiment of the present invention. Memory device 120 includes an antifuse array 116. Address pins 122 are coupled to address decoder 110 for addressing cells within memory device 120. Address decoder 110 is coupled to memory array 112 for accessing storage cells in memory array 112. Address decoder 110 is also coupled to antifuse logic circuit 114. Antifuse logic circuit 114 is coupled to antifuse array 116 for accessing and reading antifuse cells in antifuse array 116. Memory array 112 and antifuse array 116 are coupled to DRAM control logic 118 which controls read and write operations of memory device 120. Control pins 124 and I/O pins 126 are coupled to DRAM control logic 118 to provide external access and control of data stored in memory device 120.

In operation, memory device 120 uses data stored in antifuse array 116 to access cells of memory array 112. The data stored in antifuse array 116 relates to, for example, the location of defective memory cells in memory array 112, the configuration of memory device 120 or other appropriate information to be used in the operation of memory device 120. The operation of memory device 120 is described below solely with respect to using data in antifuse array 116 to identify defective cells. However, it is understood that memory device 120 can access other information stored in antifuse array 116 during operation of memory device 120.

Address decoder 110 receives addressing data via address pins 122. The addressing data is routed to antifuse logic circuit 114. Antifuse logic circuit 114 accesses information stored in antifuse array 116 to determine if the cell associated with the desired address is defective. Antifuse logic circuit 114 provides the data from antifuse array 116 to address decoder 110. If the desired cell is defective, antifuse logic circuit 114 provides an address of a substitute cell in memory array 112 to address decoder 110. If the desired cell is not defective, antifuse logic circuit 114 provides a signal to address decoder 110 that indicates that the address received at address pins 122 should be used to access the desired cell.

DRAM control logic 118 also receives an instruction via control pins 124 and input data (if any) via I/O pins 126. DRAM control logic 118 decodes and parses the instruction and input data. A read or write operation is performed on the desired cell, as indicated by address decoder 110. Output data (if any) is provided at the I/O pins 126.

Figure 2:
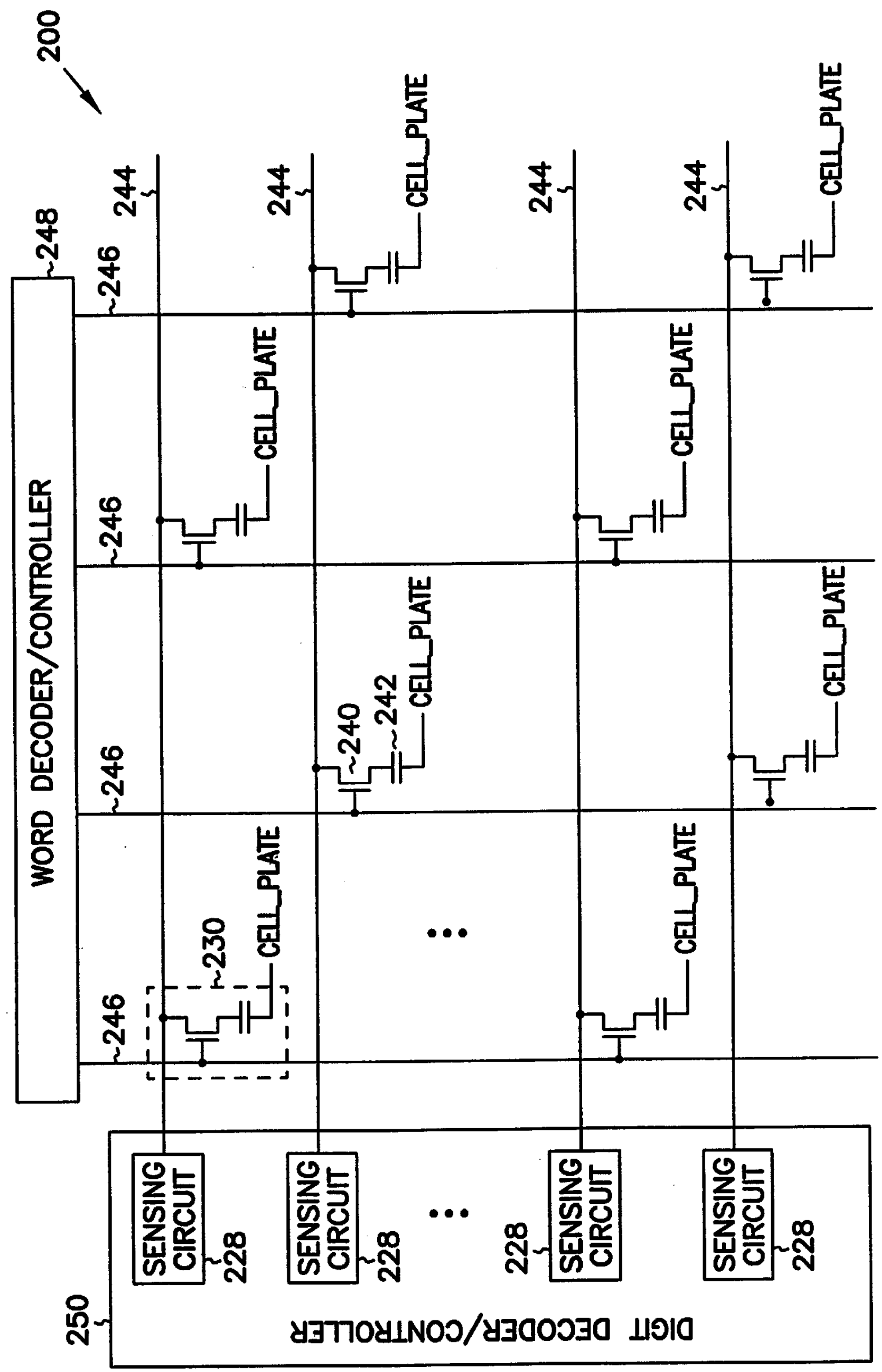
FIG. 2 is a schematic diagram of an embodiment of a portion of a the antifuse bank of FIG. 1.

FIG. 2 is a schematic diagram of a portion of an antifuse bank configured as an array, indicated generally at 200, according to one embodiment of the present invention. In this embodiment, word lines 246 are coupled to word decoder/controller 248. Digit lines 244 are coupled to digit decoder/controller 250. Antifuse cells 230 are coupled to word lines 246 and digit lines 244. Digit decoder/controller 250 includes sensing circuits 228 for detecting the state of antifuses 242 of antifuse cells 230.

Each antifuse cell 230 includes an access transistor 240 coupled to a word line 246 and a digit line 244. Transistor 240 is also coupled to an antifuse 242 that stores data. In this embodiment, antifuse 242 comprises a capacitor with a capacitance that does not exceed 25 nanofarads. Antifuse 242 is also coupled to the cell plate. Antifuse 242 can be programmed to one of two states. In a first state ("blown"), the dielectric of antifuse 242 has been destroyed, transforming antifuse 242 into a short circuit. In a second state ("unblown"), the dielectric of antifuse 242 is intact, such that antifuse 242 acts as an open circuit.

In operation, antifuse array 200 stores data for an integrated circuit such as memory device 120 of FIG. 1. Before storing data, the integrity of each antifuse 242 can be tested. To perform the initial test, the cell plate is brought to a low voltage. The word lines 246 are then sequentially brought to a high voltage. The states of the antifuses 242 of each antifuse cell 230 coupled to the same word line 246 are detected by the sensing circuits 228 while the voltage on the word line 246 is high. If an antifuse 242 is detected to be in the "blown" state, the antifuse 242 is defective since data has not yet been stored. All defective antifuses 242 are eliminated from the antifuse bank 200 during normal operation by grounding the word lines 246 coupled to antifuse cells 230 that contain a defective antifuse 242. Antifuse cells 230 that are coupled to grounded word lines 246 are not accessed during normal operation.

After the initial antifuse test has been completed, the antifuses 242 can be programmed as desired. To program an antifuse 242 to the "unblown" state, no process steps are required because antifuses 242 are originally fabricated in the unblown state. To blow an antifuse 242, the antifuse cell 230 is selected by bringing the appropriate word line 246 to a high voltage and grounding the corresponding digit line 244. The remaining word lines 246 are grounded, while the remaining digit lines 244 are brought to a high voltage. Once the desired antifuse cell 230 has been selected, a programming pulse is applied to the cell plate to program the selected antifuse 242. The programming pulse destroys the dielectric of the selected antifuse 242. Antifuse 242 becomes a short circuit.

Antifuses 242 of antifuse cells 230 that are coupled to the same digit line 244 may be programmed to the same state. This provides the advantage of redundant storage of data. Thus, data is not corrupted by a deficient storage operation. Rather, the data will only be lost if multiple antifuse cells are improperly programmed. Further, antifuse bank 200 allows this redundancy without sacrificing spatial considerations due to the efficient use of space with the array structure as compared to conventional antifuses.

Once programmed, the antifuse bank 200 can be tested for integrity. During normal operation described below, the cell plate is maintained at a low voltage level. To test the integrity of antifuse bank 200, the cell plate is brought to its normal operating level and the voltage is slowly increased. Antifuses 242 cease to operate correctly when the cell plate crosses a threshold value. In order to determine the cell plate threshold, the outputs of sensing circuits 228 are monitored while the cell plate voltage is slowly raised. When the outputs of sensing circuits 228 deviate from the expected results, the cell plate threshold has been determined. Advantageously, once the cell plate threshold is determined, the operational margin for antifuse bank 200 is known.

Figure 3:
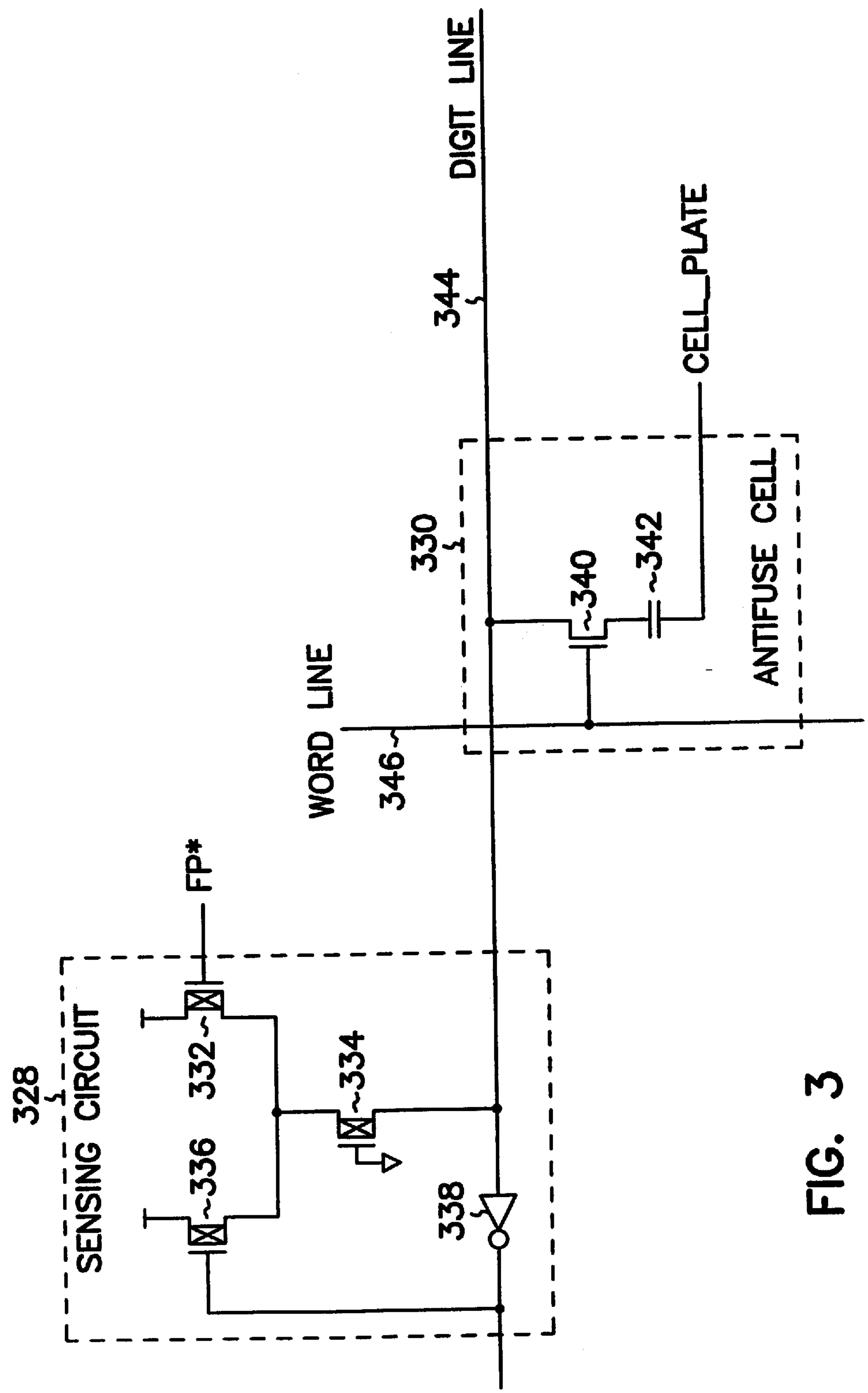
FIG. 3 is a schematic diagram of an embodiment of an antifuse cell and an embodiment of a sensing circuit for use in the antifuse bank of FIG. 1.

FIG. 3 is a schematic diagram of a sensing circuit 328 and an antifuse cell 330 according to one embodiment of the present invention. In this embodiment, sensing circuit 328 is coupled to a digit line 344 to sense the voltage on the digit line 344. Sensing circuit 328 is also coupled to an input signal FP* to control the operation of sensing circuit 328. Antifuse cell 330 is coupled to a digit line 344 and a word line 346 to provide access to antifuse cell 330. Antifuse cell 330 is also coupled to the cell plate to provide a common voltage with other antifuse cells (not shown).

Sensing circuit 328 includes three p-channel transistors 332, 334, and 336 and an inverter 338. The gate of transistor 334 is coupled to ground, therefore the transistor 334 is always on. A transistor is "on" when a voltage is applied to its gate that is sufficient to cause more than an insignificant current to flow from its drain to its source. The sources of transistors 332 and 336 are coupled to a high voltage. Transistors 332, 334, and 336 may be long L devices so that the effects of transistors 332, 334, and 336 are easily overcome.

In operation, sensing circuit 328 is activated by bringing the input signal FP* to a low voltage. When the input signal FP* is low, transistor 332 is turned on. Sensing circuit 328 brings digit line 344 to a high voltage. The output of inverter 338 is then brought to a low voltage and transistor 336 is turned on. This reinforces the high voltage of digit line 344.

The cell plate is maintained at a low voltage. In order to access the antifuse 342 of antifuse cell 330, transistor 340 is turned on by bringing the word line 346 to a high voltage. If antifuse 342 is unblown, digit line 344 remains isolated from the cell plate, and digit line 344 remains at the high voltage imposed by sensing circuit 328. If antifuse 342 is blown, transistor 340 pulls digit line 344 to a low voltage level. This overcomes the high voltage imposed on digit line 344 by sensing circuit 328. For example, if transistors 332,334, and 336 are long L devices, the high voltage imposed on digit line 344 by sensing circuit 328 is easily overcome by a blown antifuse 342. Digit line 344 is brought to a low voltage, forcing the output of inverter 338 to a high voltage. This high voltage turns off transistor 336, thus reinforcing the low voltage imposed on digit line 344 by the blown antifuse 342. The state of antifuse 342 is determined by monitoring the voltage at the output of inverter 338. A blown antifuse 342 will cause a high voltage to appear at the output of inverter 338. An unblown antifuse 342 will cause a low voltage to appear at the output of inverter 338.

What is claimed is:

1. An antifuse bank for an integrated circuit, the antifuse bank comprising:

a plurality of word and digit lines disposed to form an array;

a plurality of antifuse cells, each antifuse cell including:

an antifuse that is programmable from a first state to a second state;

an access device coupled to one of the word lines and one of the digit lines and coupled to the antifuse;

an addressing circuit coupled to the array that selects an antifuse of the array to be accessed; and a sensing circuit coupled to the array that senses a voltage that indicates the state of the selected antifuse.

2. The antifuse bank of claim 1, wherein the antifuse of each antifuse cell is coupled to a common node.

3. The antifuse bank of claim 1, wherein a sensing circuit is coupled to each digit line.

4. The antifuse bank of claim 1, wherein each antifuse associated with a common digit line is programmed to the same state.

5. The antifuse bank of claim 1, wherein the antifuse of each antifuse cell comprises a capacitive element, wherein the capacitance does not exceed 25 nanofarads.

6. A method for reading data from a cell of an antifuse array, comprising the steps of:

establishing a first voltage on a digit line that is coupled to the cell of the antifuse array;

setting a common node of each cell to a second voltage;

activating an access device of the cell; and monitoring the voltage on the digit line with a sensing circuit coupled to the digit line to determine the state of an antifuse of the cell.

7. The method of claim 6, wherein the step of establishing a first voltage on a digit line comprises the step of establishing a high voltage level on the digit line with a long L device.

8. A method for shorting an antifuse of a cell of an antifuse array, comprising the steps of:

activating an access transistor of the cell;

establishing a first voltage on a digit line coupled to the cell to provide a voltage level to a first node of the antifuse; and applying a voltage pulse to a second node of the antifuse.

9. A method of determining an operational margin of a programmed array of antifuses, comprising the steps of:

establishing a first voltage on a cell plate node which is common to each antifuse of the array within normal operating range;

varying the voltage on the common node; and monitoring the operation of the antifuses of the array.

10. The method of step 9, wherein the step of varying the voltage on the cell plate node is performed incrementally.

11. A method for testing a plurality of unprogrammed cells of an antifuse array, comprising the steps of:

establishing a first voltage on a cell plate which is a common node to each of the unprogrammed cells of the antifuse array;

activating a plurality of access transistors of the cells; and monitoring the voltage on a plurality of digit lines coupled to the cells.

12. The method of claim 11, wherein the step of activating a plurality of access transistors comprises the step of sequentially establishing a second voltage on a plurality of word lines coupled to the cells.

* * * * *